United States Patent
Lindenberg et al.

(10) Patent No.: US 9,640,372 B2
(45) Date of Patent: May 2, 2017

(54) METHOD AND SYSTEM FOR MAINTAINING AN EDGE EXCLUSION SHIELD

(71) Applicants: Ralph Lindenberg, Büdingen-Rinderbügen (DE); Erkan Koparal, Nidderau (DE)

(72) Inventors: Ralph Lindenberg, Büdingen-Rinderbügen (DE); Erkan Koparal, Nidderau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/440,943

(22) PCT Filed: Nov. 15, 2012

(86) PCT No.: PCT/EP2012/072777
§ 371 (c)(1),
(2) Date: May 6, 2015

(87) PCT Pub. No.: WO2014/075729
PCT Pub. Date: May 22, 2014

(65) Prior Publication Data
US 2015/0303041 A1  Oct. 22, 2015

(51) Int. Cl.
*C23C 14/34* (2006.01)
*H01J 37/34* (2006.01)
(Continued)

(52) U.S. Cl.
CPC ........ *H01J 37/3441* (2013.01); *C23C 14/042* (2013.01); *C23C 14/50* (2013.01);
(Continued)

(58) Field of Classification Search
CPC ..... C23C 14/042; C23C 14/50; C23C 14/564; C23C 14/568; C23C 16/042;
(Continued)

(56) References Cited

U.S. PATENT DOCUMENTS

| | | | |
|---|---|---|---|
| 5,478,455 A | * | 12/1995 | Actor ............ C23C 14/54 204/192.13 |
| 2004/0009652 A1 | | 1/2004 | Chung |
| 2007/0009652 A1 | | 1/2007 | Manz et al. |

FOREIGN PATENT DOCUMENTS

| | | |
|---|---|---|
| CN | 1139957 A | 1/1997 |
| EP | 1622192 A1 | 2/2006 |

(Continued)

OTHER PUBLICATIONS

International Search Report and Written Opinion dated Aug. 5, 2013 for Application No. PCT/EP2012/072777.

(Continued)

*Primary Examiner* — Rodney McDonald
(74) *Attorney, Agent, or Firm* — Patterson + Sheridan, LLP

(57) ABSTRACT

A method for extracting a shielding element from a processing chamber of a substrate processing system or inserting the shielding element into the processing chamber is provided. The substrate processing system includes the processing chamber, a first shielding element for excluding application of material onto parts of a substrate, and a substrate transportation system for transporting substrates or substrate carriers into and out of the processing chamber. The method includes transporting the first shielding element by the substrate transportation system.

13 Claims, 5 Drawing Sheets

(51) Int. Cl.
  *C23C 14/04* (2006.01)
  *C23C 14/50* (2006.01)
  *C23C 14/56* (2006.01)
  *C23C 16/04* (2006.01)
  *C23C 16/44* (2006.01)
  *H01L 21/67* (2006.01)
  *H01L 21/677* (2006.01)

(52) U.S. Cl.
  CPC .......... *C23C 14/564* (2013.01); *C23C 14/568* (2013.01); *C23C 16/042* (2013.01); *C23C 16/4401* (2013.01); *H01L 21/6776* (2013.01); *H01L 21/67173* (2013.01); *H01L 21/67751* (2013.01); *H01J 2237/3323* (2013.01)

(58) Field of Classification Search
  CPC .............. C23C 16/4401; H01J 37/3441; H01J 21/67173; H01J 21/67751; H01J 21/6776; H01J 2237/3323; H01L 21/67173; H01L 21/67751; H01L 21/6776

USPC .............. 204/192.12, 298.11; 118/504, 505; 427/143, 468
  See application file for complete search history.

(56) References Cited

FOREIGN PATENT DOCUMENTS

| | | |
|---|---|---|
| EP | 2159302 | 3/2010 |
| EP | 2432008 | 3/2012 |
| JP | 2004335601 A | 11/2004 |

OTHER PUBLICATIONS

Notice of Reasons for Rejection dated Jul. 26, 2016 for Application No. 2015-542173.
Chinese Office Action dated Aug. 2, 2016, for Chinese Patent Application No. 201280076987.4.

\* cited by examiner

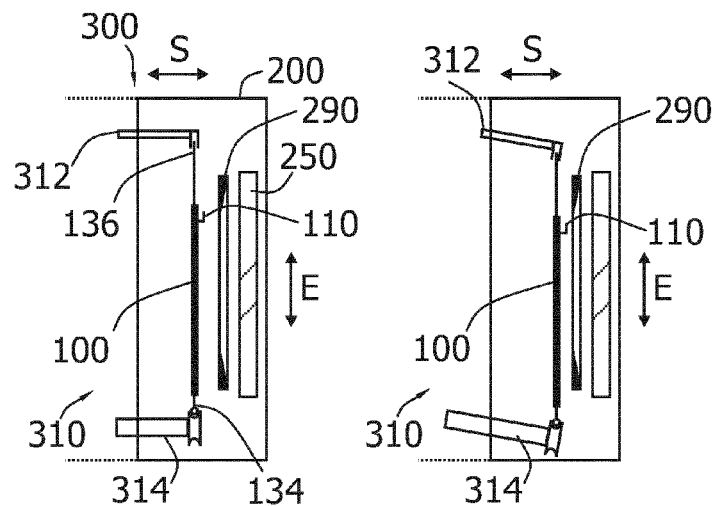
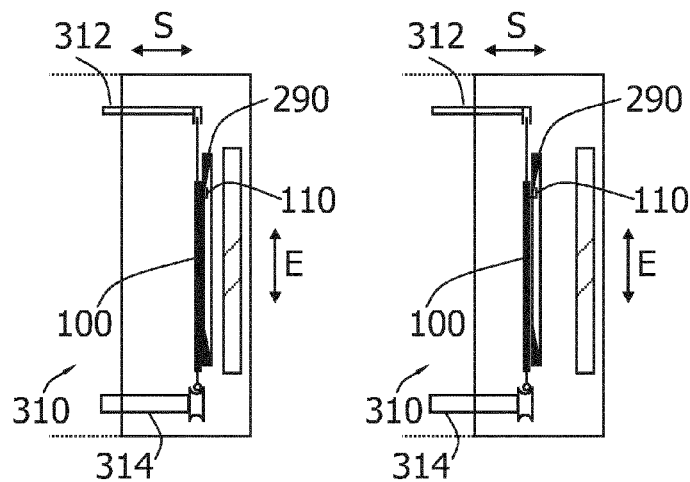
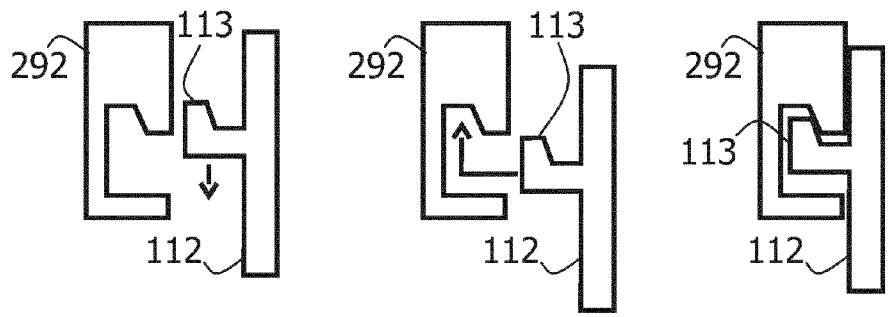

METHOD AND SYSTEM FOR MAINTAINING AN EDGE EXCLUSION SHIELD

FIELD OF THE INVENTION

Embodiments of the present invention relate to a method of for extracting a shielding element from a processing chamber of a substrate processing system or inserting the shielding element into the processing chamber. Further embodiments relate to a shielding element, a hook-up device for transfer of a shielding element, and to a substrate processing system including the shielding element and/or the hook-up device. More specifically, some embodiments relate to maintenance of an edge exclusion shield in a substrate processing system including a vacuum processing chamber for processing substantially vertically oriented substrates.

BACKGROUND OF THE INVENTION

In a number of technical applications, e.g., TFT metallization processes, one or multiple layers of different materials are deposited onto each other over a substrate. Typically, this is done in a sequence of coating or deposition processes, e.g., sputtering processes, wherein other processes like etching or structuring might also be provided before, between, or after the various deposition processes. For example, a multilayer stack with a sequence of "material one"-"material two"-"material one" can be deposited.

In order to deposit a multiple layer stack, a number of configurations of processing chambers can be provided. For example, in-line arrangements of deposition chambers can be used as well as cluster arrangements of deposition chambers. A typical cluster arrangement comprises a central handling chamber and a number of processing or deposition chambers connected thereto. The coating chambers may be equipped to carry out the same or different processes. A typical in-line system includes a number of subsequent processing chambers, wherein processing steps are conducted in one chamber after the other such that a plurality of substrates can continuously or quasi-continuously be processed with the in-line system.

In technical applications such as the coating of glass substrates for displays, the edges of substrates are protected during a coating process, e.g., a sputter deposition process. An edge exclusion shield is used to protect the edges. Not only the substrates, but also the edge exclusion shields receive a coating during the coating process. As the coating on an edge exclusion shield becomes thicker, more and more particles may be re-emitted from the edge exclusion shield and deteriorate the quality of the substrate coating. A thick layer already deposited on the edge exclusion shield may have a shadowing effect, so the uniformity of the substrate coating can become worse.

If this happens, the deposition chamber is opened and the edge exclusion shield is replaced. This process may necessitate not only exchanging the edge exclusion shield, but also other components of the process kit such as additional shields, anodes etc. In a sputter substrate processing system, the target lifetime may be much longer than the time periods after which the edge exclusion shield needs replacement. The optimized lifetime of targets may therefore not come to full fruition. Moreover, the recovery time until the production can resume may be very long. For instance, re-establishing the vacuum in the chamber, but also other set-up processes, may take a long time that is hard to predict. Therefore, the overall output of the substrate processing system is negatively influenced.

Therefore, there is a need for improvement.

SUMMARY

In light of the above, a method, and a device according to the independent claims are provided. Further details can be found in the dependent claims, the description, and the drawings.

According to one embodiment, a method for extracting a shielding element from a processing chamber of a substrate processing system or inserting the shielding element into the processing chamber is provided. The substrate processing system includes the processing chamber, a first shielding element for excluding application of material onto parts of a substrate, and a substrate transportation system for transporting substrates or substrate carriers into and out of the processing chamber. The method includes transporting the first shielding element by the substrate transportation system.

According to another embodiment, a shielding element for excluding an application of material onto parts of a substrate is provided. The shielding element includes a shielding portion for shielding the substrate edges. In a first alternative, the shielding element includes an engagement portion for transferring the shielding element from a position within a shield frame to a substrate transportation system of a substrate processing system for transportation in the substrate transportation system. In a second alternative, the shielding element includes an engagement portion for hooking up the shielding element to a hook-up device for joint transportation in the substrate transportation system of the substrate processing system.

According to further embodiments, the shield frame or the hook-up device may be additionally provided. The shield frame may include a mechanical transfer portion adapted to engage the engagement portion for transferring the shielding element from the position within the shield frame to the substrate transportation system. The hook-up device may include a frame portion configured for being loaded into the substrate transportation system of the substrate processing system and a hook-up portion for engaging the engagement portion of the shielding element to hook up and hold the shielding element for the joint transportation in the substrate transportation system. In further embodiments, a substrate processing system may be provided. The substrate processing system may include a processing chamber and a substrate transportation system for transporting substrates or substrate carriers into and out of the processing chamber. The substrate processing system may further include a shielding element, a shield frame and/or a hook up device according to any of the embodiments described herein. The shielding element or the frame portion of the hook-up device may be configured for transport in the substrate transportation system for transportation of the shielding element into or out of the processing chamber.

The disclosure is also directed to an apparatus for carrying out the disclosed methods, including apparatus parts for performing each of the described parts of the method. These method parts may be performed by way of hardware components, a computer programmed by appropriate software, by any combination of the two or in any other manner. Furthermore, the invention is also directed to methods by which the described apparatus operates or is manufactured. It includes methods for carrying out every function of the apparatus.

BRIEF DESCRIPTION OF THE DRAWINGS

So that the manner in which the above recited features can be understood in detail, a more particular description may be had by reference to embodiments. The accompanying drawings relate to embodiments and are described in the following:

FIGS. 5-8 show an edge exclusion shield and a hook-up device and illustrate a method of maintaining an edge exclusion shield according to embodiments described herein;

FIGS. 9-14 illustrate mechanical engagement between an edge exclusion shield and a hook-up device according to embodiments described herein;

DETAILED DESCRIPTION OF THE INVENTION

Figure 1:
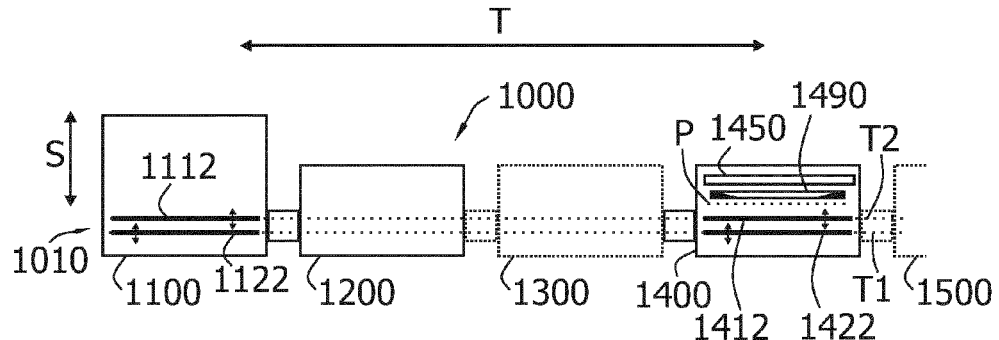
FIG. 1 shows a schematic illustration of a substrate processing system in which embodiments of the invention may be carried out or used.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Within the following description of the drawings, the same reference numbers refer to the same or similar components. Generally, only the differences with respect to the individual embodiments are described. The structures shown in the drawings are not necessarily depicted true to scale or angle, and may exaggerate features for a better understanding of the corresponding embodiments.

The term "direction" as used herein is not limited to the meaning of a vectored direction ("from A to B"), but includes both vectored directions in which a straight line can be followed ("from A to B" and "from B to A"). For example, the vertical direction shall include both the notions of up and down. Directions are therefore indicated by arrows with two arrow heads in the drawings.

The term "substrate" as used herein shall embrace substrates, such as glass substrates. Thereby, the substrates are typically large area substrates with a size of 1.4 $m^2$ and above, typically 5 $m^2$ and above. For example, substrate sizes of 1.43 $m^2$ (Gen5) and above, such as 5.5 $m^2$ (Gen8.5), 9 $m^2$ (Gen10) or larger can be realized.

Typically, the substrates are vertically oriented or substantially vertically oriented. Thereby, it is to be understood that a substantially vertically oriented substrate can have some deviation from a vertical orientation in a processing system in order to allow for stable transport with an inclination by a few degrees, e.g., at most 15° or at most 10°, e.g., from 5° to 7° or less. The substrates are then said to be substantially or essentially vertically oriented. A substrate is substantially vertically oriented if the normal to its largest surfaces (front and back surfaces) is substantially horizontally oriented, i.e., the normal has a tilt of at most a few degrees, e.g., at most 15° or at most 10°, e.g., from 5° to 7° or less. At least one of the largest surfaces, i.e., at least one of the front and back surfaces, is typically coated in substrate processing systems in which a substrate transfer device according to embodiments described herein may be used. A substantially horizontally oriented substrate has a normal to its largest surfaces that is tilted at most a few degrees from the vertical direction, such as at most 15° or at most 10°, such as from 5° to 7° or less.

FIG. 1 schematically shows an exemplary substrate processing system 1000. FIG. 1 represents a top view if (substantially) vertically oriented substrates are processed, and represents a side view if (substantially) horizontally oriented substrates are processed, e.g., in sputter down process modules. The substrate processing system 1000 includes a front end module 1100, a load module 1200, and process module 1400. The substrate processing system includes a substrate transportation system 1010 for transporting substrates or substrate carriers through the substrate processing system, in particular into or out of the process module(s).

The front end module 1100 may be a swing module for loading substrates into carriers and unloading them from their carriers. The swing module may be a dual-track swing module including a dual-track transfer device that provides two tracks for supporting a substrate or substrate carrier, wherein the two tracks are movable relatively to each other in the switch direction S. Transfer devices with relatively moveable or switchable tracks are described in detail in PCT/EP2012/067659, which is incorporated herein by reference in its entirety. Alternatively the front end module may include one or more robots such as a multi-axis robot for substrate loading and unloading, e.g., a 6-axis robot. According to a further alternative, the front end module may include a device for substantially vertical substrate loading and unloading.

The substrate processing system 1000 may optionally include further modules, e.g., a second load module 1300 and/or one or more further modules indicated by reference sign 1500, e.g., further process modules. The substrate processing system 1000 may include, e.g., one, two or more further process modules. These optional modules are shown in dotted lines in FIG. 1. Two transport paths T1 and T2 of the substrate transportation system 1010 extend along the transport direction T and are spaced apart in a switch direction S that is perpendicular to the transport direction T. The front end module 1100, if embodied in the form of a swing module, may include a relatively moveable dual-track substrate transfer device having two tracks 1112 and 1122. Double-headed arrows in FIG. 1 indicate that the tracks 1112 and 1122 are moveable relatively to each other, or even independently of each other, at least in the switch direction S. The process module 1400 is shown to include a relatively moveable dual-track substrate transfer device having two tracks 1412 and 1422. Double-headed arrows in FIG. 1 indicate that the tracks 1412 and 1422 are moveable relatively to each other, or even independently of each other, at least in the switch direction S.

The modules are arranged for substrate transfer between every pair of neighboring modules by the substrate transportation system 1010. For example, substrates or substrate carriers loaded with respective substrates may be exchanged, typically simultaneously exchanged, between neighboring modules. Details about substrate exchange between chambers, and the routing of substrates or substrate carriers through a substrate processing system can be found in PCT/EP2012/067656, which is incorporated herein by reference in its entirety. A substrate or substrate carrier may be moved with its track supporting it from one transport path to the other in at least one module by a relatively moveably substrate transfer device, e.g., in the front end module 1100 and process module 1400. This allows for a fast transversal movement. Further, compared to handling a substrate or substrate carrier with a handling device for moving it from one transport path to the other, no possibly detrimental particles are generated when the substrate or substrate carrier is moved with its track.

The process module 1400 includes a deposition source 1450. A process position P is shown in the process module 1400. The process module, also called process chamber, includes an edge exclusion shield 1490. When a substrate, typically held by a substrate carrier, is to be coated in the process module it is transferred to the process position such that the edge exclusion shield will prevent a coating of the edges of the substrate.

Figure 2:
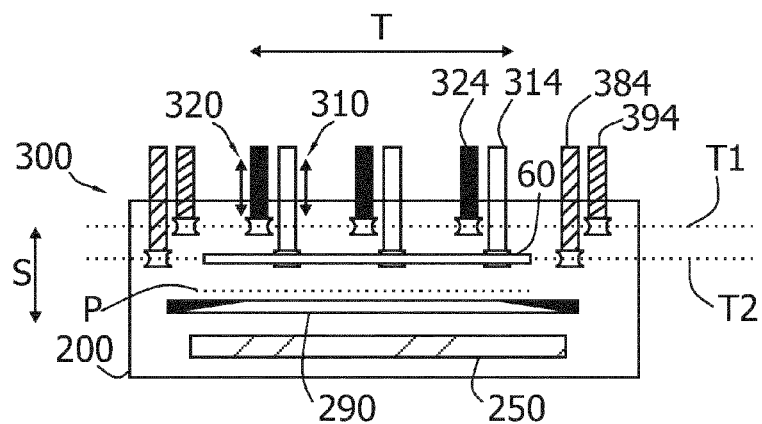
FIG. 2 shows a schematic illustration of a substrate processing chamber in connection with which embodiments of the invention may be carried out or used.

FIG. 2 shows a substrate processing chamber 200 including a deposition source 250, an edge exclusion shield 290, and a transport device including a first substrate support assembly 310 and second substrate support assembly 320, both being movable independently of each other in the switch direction S as indicated by the double-headed arrows to the left of assembly 320 and to the right of assembly 310. The transport device forms part of a substrate transportation system 300. The first substrate support assembly 310 includes first support elements including a set of first rollers 314, and the second substrate support assembly 320 includes second support elements including a set of second rollers 324. The first and second sets of rollers 314, 324 are moveable in the switch direction. A substrate 60 is supported by the rollers 314 in FIG. 2. Additionally, static support elements 384, 394 that are not movable in the switch direction, e.g., static rollers may be provided.

The rollers 314, 324 can pass each other in the switch direction S, even if one set of rollers, e.g., set of rollers 314, supports a substrate. To this effect, one set of rollers may perform an evasion movement in an evasion direction perpendicular to the plane of drawing, in particular perpendicular to the switch direction S and perpendicular to the transport direction T. Details about such a track exchange and the corresponding movements of substrate support elements can be found in PCT/EP2012/067659.

Figure 3:
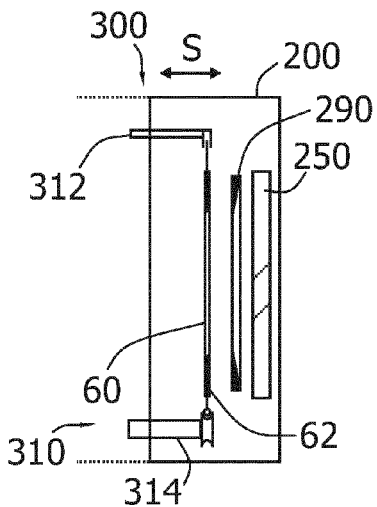
FIGS. 3-4 illustrate the coating of a substrate by a sputter target using an edge exclusion shield.
Figure 4:
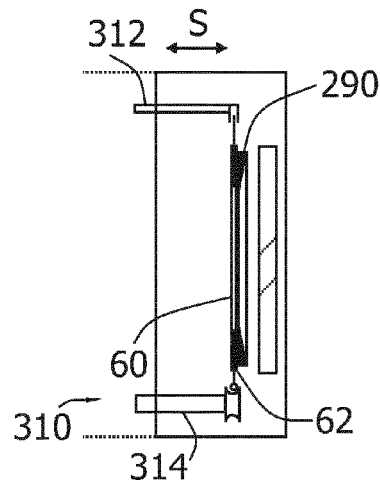

FIGS. 3 and 4 show views of the chamber 200 along the transport direction that is perpendicular to the plane of drawing. For simplicity, the second substrate support assembly is not shown. FIGS. 3 and 4 schematically illustrate the coating of a substrate 60 that is held in a carrier 62. The carrier 62 is held by the first substrate support assembly 310, in particular by a set of support rollers 314 and magnetic guides 312. The substrate 60 in its carrier 62 is moved, from the position on the transport path T2 as shown in FIG. 3, in the switch direction towards the processing position P (see FIG. 2). In FIG. 4, the substrate 60 is in the processing position near the edge exclusion shield 290. The edge exclusion shield 290 shields the edges of the substrate from receiving a coating when material is deposited onto the substrate from the deposition source 250.

Material is not only deposited on the substrate, but also on the edge exclusion shield 290. In the course of depositing material on several substrates in the process chamber 200, the coating on the edge exclusion shield becomes thicker and thicker. This leads to a re-emission of particles from the edge exclusion shield, which may land on a substrate. Further, a thick layer of deposited material on the edge exclusion shield may have a shadowing effect so that the substrate is less uniformly coated. Both effects reduce the quality of the substrate coating.

Conventionally, the process chamber 200 is opened to replace the edge exclusion shield by a fresh or maintained edge exclusion shield. This may lead to long down times of the substrate processing system, in particular when the process chamber is a high vacuum chamber.

According to embodiments of the invention, an edge exclusion shield is transported by the substrate transportation system. For instance, the edge exclusion shield may be removed from a process chamber, or inserted into a process chamber if it is fresh or has been maintained, by using the substrate transportation system. The edge exclusion shield may be transported out of a deposition chamber or into a deposition chamber by the substrate transportation system similarly to a substrate or substrate carrier.

Therein, the edge exclusion shield may be passively transported. To this end, a hook-up device that is adapted for transport in the substrate transportation system may be loaded into the substrate transportation system and transferred to the edge exclusion shield that needs replacement. The hook-up device may hook up the edge exclusion shield and carry it out of the chamber or out of the substrate processing system. Alternatively, the edge exclusion shield may be actively transported. To this end, the edge exclusion shield itself may be adapted to use at least a part of the substrate transportation system like a substrate or substrate carrier. Figuratively speaking, the edge exclusion shield rides the substrate transportation system itself in this alternative. Both alternatives will be described in detail herein.

When using the substrate transportation system for exchanging edge exclusion shields the deposition chamber need not be opened. A vacuum inside the deposition chamber can be maintained because the edge exclusion shield may exit the deposition chamber or the vacuum section of the substrate processing system via load modules or locks through which also the substrates or carriers enter and exit.

According to an embodiment schematically shown in FIGS. 5-7, a hook-up device 100 has been loaded into the substrate transportation system and transferred into the deposition chamber 200 along a transport direction perpendicular to the plane of drawing. In FIG. 5, the hook-up device 100 is supported by the substrate support assembly 310, in particular by a set of supporting rollers 314 and by a set of magnetic support elements 312. The hook-up device includes a frame portion configured for being loaded into the substrate transportation system. The frame portion includes a guiding element 134 adapted to engage with the supporting rollers 314, e.g., a rod-like element fitting into the rolls, and includes a guiding element 136 of magnetic material adapted to be supported by the magnetic support elements 312. The hook-up device further includes a hook-up portion 110, symbolically shown as a simple hook in FIGS. 5-7. The hook-up portion is configured for engaging an engagement portion of the edge exclusion shield 290 to hook up and hold the edge exclusion shield for joint transportation in the substrate transportation system.

For engaging the edge exclusion shield 290, the hook-up device may be moved in the switch direction towards the position that is the process position for regular substrates or substrate carriers. To hook up the edge exclusion shield 290, the hook-up device may also be moved in an evasion direction E perpendicular to the switch direction and perpendicular to the transport direction. In FIG. 6, the hook-up device 100 is lowered while being supported by the substrate support assembly 310. In this embodiment, the rollers 314 and magnetic support elements 312 are tilted downwards while holding the hook-up device 100. Once the carrier device has advanced to the process position and contacts the edge exclusion shield 290, the hook-up device is moved again in the evasion direction, but opposite to the first movement. In FIG. 7, the hook-up device 100 has been raised such that the hook-up portion 110 now engages the edge exclusion shield 290.

The rollers 314 and magnetic support elements 312 may then be moved back to a position on a transport path while supporting both the hook-up device 100 and the edge exclusion shield 290 that is hooked-up to the hook-up device as shown in FIG. 8. The edge exclusion shield may be supported by a shield frame in its regular position for substrate processing, and may be released therefrom when the hook-up device 100 and the edge exclusion shield 290 are jointly transferred to a position on a transport path. Then, the hook-up device 100 and the edge exclusion shield 290 may be jointly transported in the transport direction out of the deposition chamber 200. Details about transportation with a substrate transportation system may, e.g., be found in PCT/EP2012/067659 and PCT/EP2012/067656. The locks between the chamber 200 and an adjacent chamber may be dimensioned so as to accommodate the joint passage of the hook-up device and the hooked-up edge exclusion shield. The edge exclusion shield may be transported out of a vacuum section of the substrate processing system or out of the entire substrate processing system for maintenance.

Hooking-up the edge exclusion shield with a hook-up device may also be performed with substrate transportation systems which do not have relatively movable and/or tiltable substrate support assemblies. For instance, the hook-up portion of the hook-up device may be movable relatively to the frame portion at least in the evasion direction. An energy source for powering such movement may be included in the hook-up device. A plug-in connectivity with interlock may also be realized.

Figure 12:
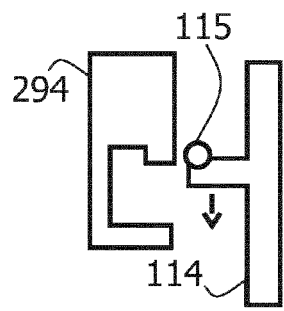
Figure 13:
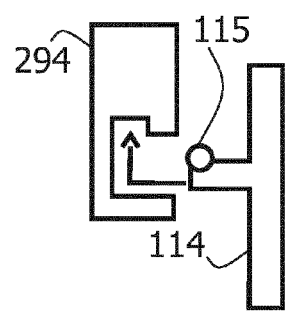
Figure 14:
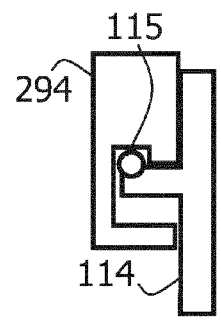

FIGS. 9-14 illustrate how the hook-up portion of the hook-up device engages an engagement portion of the edge exclusion shield. FIGS. 9-11 show an engaging element 292 of the edge exclusion shield and a hook-up element 112 of the hook-up device. The prism-like hook 113 of the hook-up element 112 is configured for engaging a corresponding recess in the engaging element 292. Hook-up element 112 may be lowered, alone or together with the frame portion of the hook-up device, as shown in FIG. 9, inserted in the recess and moved up as shown in FIG. 10, so as to engage the engaging element 292 and keep it in a well-defined position as shown in FIG. 11. FIGS. 12-14 similarly show a hook-up element 114 with a rod-like element 115 for engaging into a groove of an engaging element 294 of the edge exclusion shield. In one embodiment, the hook-up portion of the hook-up device includes one or more hook-up elements 112 in an upper part and one or more hook-up elements 114 in a lower part for engaging corresponding engaging elements 292, 294 included in an engagement portion of the edge exclusion shield.

Figure 15:
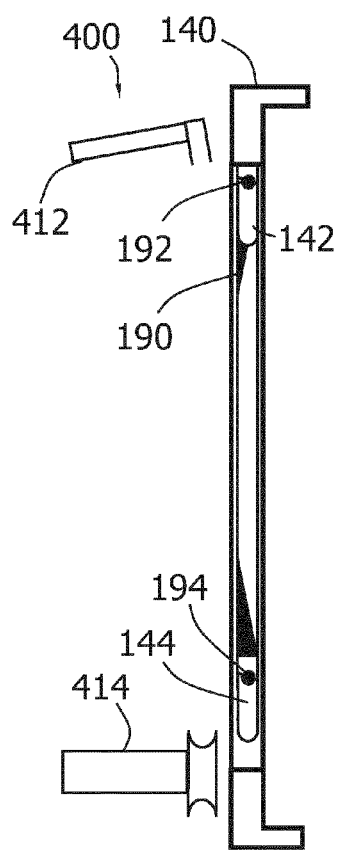
FIGS. 15-17 show an edge exclusion shield and a shield frame according to embodiments described herein.
Figure 16:
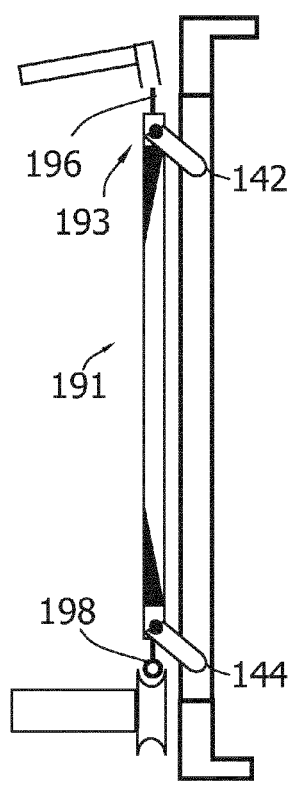
Figure 17:
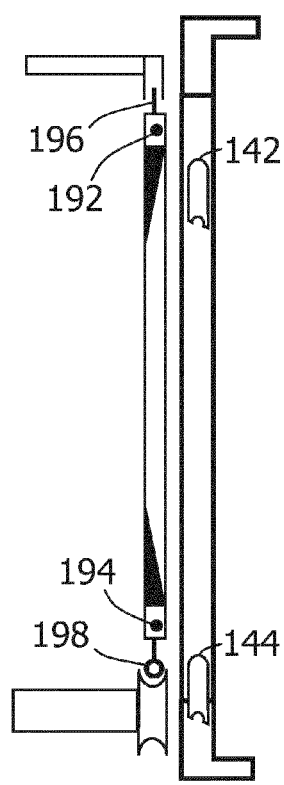

FIGS. 15-17 illustrate an embodiment where the edge exclusion shield is actively transported by the substrate transportation system. In FIG. 15, the edge exclusion shield 190 has an engagement portion including engagement elements 192, 194 which are bar-like or rod-like. A transfer portion including two lever-like elements 142, 144 of a shield frame 140 conform to the engagement elements 192, 194. The edge exclusion shield 190 is held within the shield frame 140 by the engaged lever elements 142, 144 and engagement elements 192, 194. A substrate support assembly forming part of a substrate transportation system 400 and including a set of rollers 414 and magnetic support elements 412 has been moved close to the shield frame 140 that is holding the edge exclusion shield 190. The magnetic support elements 412 are tilted away from the set of rollers 414 to increase the distance therebetween.

Hidden in FIG. 15, but shown in FIG. 16, the edge exclusion shield 190 further includes a framing portion 193. The framing portion surrounds a shielding portion 191 that is used for shielding edges of substrates during processing. The framing portion includes a guiding element 198 adapted to engage with the supporting rollers 414, e.g., a rod-like element fitting into the rolls, and includes a guiding element 196 of magnetic material adapted to be supported by the magnetic support elements 412.

As shown in FIG. 16, the levers 142, 144 can lift the edge exclusion shield 190 out of the shield frame 140 and transfer the edge exclusion shield 190 to the substrate transportation system, here in particular to the rollers 414 and magnetic support elements 412. Then, the magnetic support elements 412 may be tilted back to decrease the distance between them and the rollers 414. Thereby, they magnetically engage with the guiding element 196 to support the edge exclusion shield 190. The levers 142, 144 may then disengage from the engaging elements 192, 194 of the edge exclusion shield. In FIG. 17, the levers are exemplarily shown to have turned further in anti-clock-wise direction and have disengaged. The power for moving the levers may be provided to a driving part of the shield frame from outside of the deposition chamber. The edge exclusion shield is now directly supported by the substrate support assembly, may be transferred to a position on a transport path, and may be transported out of the deposition chamber.

Figure 18:
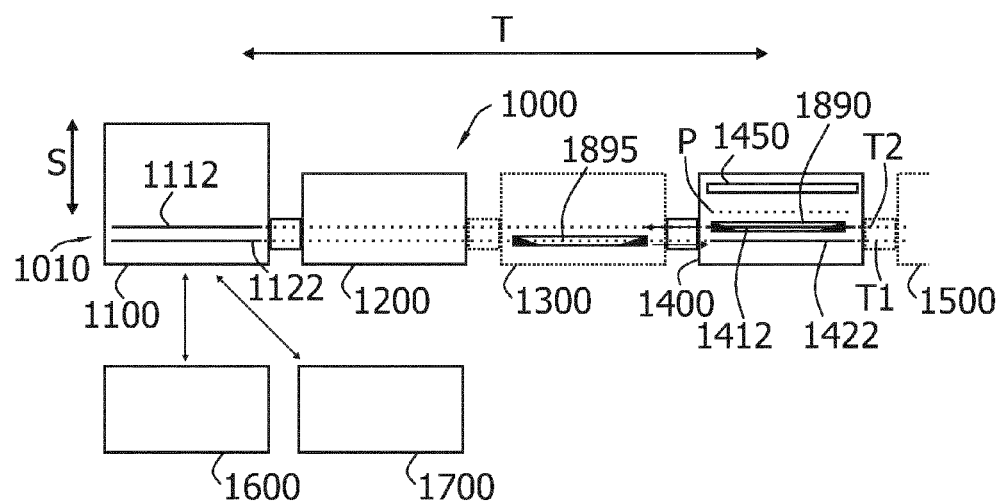
FIG. 18 shows a schematic illustration of a substrate processing system according to an embodiment described herein.

When the edge exclusion shield has been moved out of a vacuum portion of the substrate support system, maintenance may be carried out. During maintenance the coating of deposited material is removed from the edge exclusion shield. In an embodiment shown in FIG. 18, the substrate processing system 1000 includes a carrier maintenance station 1600 for cleaning carriers, and maintenance station 1700 for maintaining edge exclusion shields. The stations 1600 and 1700 may also be one and the same station.

An edge exclusion shield 1890, either hooked-up to a hook-up device or solo, has been transferred to a position on the second transport path T2. A second edge exclusion shield 1895, either hooked-up to a second hook-up device or solo, has been transported on the first transport path via swing module 1100 and load module 1200 into load module 1300. Next, the edge exclusion shield 1895 and the edge exclusion shield 1890 may be simultaneously exchanged between the load module 1300 and the process module 1400. The edge exclusion shield 1895, which is a maintained or fresh edge exclusion shield, is transferred to a position close to the process position P of the substrates where it can shield substrate edges. The edge exclusion shield 1895 may then be conditioned, e.g., heated or plasma-treated. This is advantageous to rid it of moisture that could negatively influence the coating process. The moisture can be evacuated from the process chamber by the vacuum system. The edge exclusion shield 1890 may be transported with the substrate transport system through the load modules 1200, 1300 and through the swing module 1100 to the maintenance station 1700.

The edge exclusion shield 1890 may be maintained in the maintenance station 1700 and re-inserted into the process module 1400 via modules 1100, 1200 and 1300 once the second edge exclusion mask 1895 needs replacement.

According to embodiments described herein, a method for extracting a shielding element from a processing chamber of a substrate processing system or inserting the shielding element into the processing chamber is provided. The method may be a method of maintenance of a shielding element, e.g., of an edge exclusion shield, of a substrate processing system. Embodiments also relate to a shielding element, such as an edge exclusion shield, to a hook-up device, the combination of a shielding element and a hook-up device, and to a substrate processing system.

The shielding element may be an edge exclusion shield for excluding an application of material onto substrate edges. The application of material may be a deposition, e.g., a sputter deposition. The shielding element may be any other element that is shielding at least a part of a substrate from receiving a coating, e.g., a mask. For simplicity, and without intending a limitation, reference will often be made to an edge exclusion shield, to the deposition of material and to a deposition chamber.

The substrate processing system may be a system for processing, in particular coating, a substantially vertically oriented substrate. Alternatively, substantially horizontally oriented substrates may be processed. The substrate processing system may be an inline system or may include at least one hub, e.g., a central chamber with a multi-axis robot. The substrate processing system may include a front end module, a load module, and a process module also called process chamber. The process chamber may be a deposition chamber, in particular a sputter chamber. The substrate processing system may include further load or process modules, e.g., a second load module and/or a second, third or fourth process module. In embodiments with two load modules, the first load module may connected to a first pump system adapted to pump down the first load module to an intermediate vacuum, and the second load module may be connected to a second pump system adapted to pump down the second load module to a high vacuum. The intermediate vacuum may be in the range of 0.05 mbar to 1 mbar, such as about 0.1 mbar. The high vacuum may be 0.001 mbar or less, typically in the range from 10-5 mbar to 10-4 mbar, such as about 5*10-5 mbar. The process chamber(s) may all be evacuable to high vacuum.

In some embodiments, the front end module is adapted for loading substrates into carriers. The front end module may form an atmospheric portion of the substrate processing system, i.e., a portion not under vacuum. The load module or the load modules may be a lock between an atmospheric portion and a vacuum portion of the substrate processing system. Load modules may be regarded as loading substrates or substrate carriers into the vacuum portion or unloading them therefrom. The vacuum portion may include the process module(s). The process module(s) may be vacuum process module(s). The high vacuum may be present in modules of the vacuum portion of the substrate processing system. The substrate processing system may include a carrier maintenance station and/or an edge exclusion shield maintenance station. These two stations may also be one and the same, namely a combined station for maintenance of carriers and edge exclusion shields.

The front end module, load module and process module(s) may be arranged for substrate transfer between these modules along a transport direction. The substrates may be transferred in respective carriers. The substrate processing system may have at least two transport paths extending parallel to each other in the transport direction. Typically, the substrate processing system has a first transport path and a second transport path. The first transport path and the second transport path are displaced with respect to each other in a direction perpendicular to the transport direction. This direction will be called switch direction. In substrate processing systems with a hub, there may be more than one transport direction and corresponding transport paths along each of these transport directions.

At least one of the front end module, load module and process module includes a substrate transfer device, e.g., a dual-track substrate transfer device or triple-track substrate transfer device or quadruple-track substrate transfer device. The process module may be the last module in a row of modules that starts with the front end module. The process module may include the substrate transfer device. A dual-track substrate transfer device provides two individual tracks for supporting a substrate or substrate carrier, a triple-track substrate transfer device provides three individual tracks for supporting a substrate or substrate carrier, a quadruple-track substrate transfer device provides four individual tracks for supporting a substrate or substrate carrier, and an n-tuple-track substrate transfer device provides n individual tracks for supporting a substrate or substrate carrier, where n is a natural number. A track is a space defined that can support a substrate or substrate carrier. The track may be defined by a substrate support assembly or by its support elements. Any number m of tracks of an n-tuple-track substrate transfer may be movable relatively to each other in at least one direction perpendicular to the transport direction, in particular in the switch direction, where m is an integer out of the range from 0 to n. In other words, two or more of the at least two tracks of a substrate transfer device may be movable relatively to each other at least in the switch direction. In a dual-track substrate transfer device, the two tracks may be movable relatively to each other in at least one direction perpendicular to the transport direction, in particular in the switch direction.

Two tracks of a substrate transfer device may be movable independently of each other at least in the switch direction. The front end module, process module or other modules such as transfer modules may be configured such that the two tracks may pass each other in the switch direction. The first track may be aligned with the first transport path, and may be aligned also with the second transport path at a different time. In other words, the first track may be alignable with the first transport path and alternatively with the second transport path. The second track may be aligned with the first transport path, and may be aligned also with the second transport path at a different time. In other words, the second track may be alignable with the first transport path and alternatively with the second transport path.

A process module, i.e., a substrate processing chamber, includes a deposition source. Deposition sources, according to embodiments described herein, may be, e.g., sputter sources, more specifically planar or rotary target sputter sources. Rotary targets may enable high deposition rates via superior cooling of the target surface as compared to planar target technology.

In process modules, the first track and/or second track may be alignable with a process position. The process position is typically closer to a deposition source than the first and second transport paths. A substrate or substrate carrier may be brought into alignment with an edge exclusion shield in the process position. The deposition mask can be immovable at a fixed location with respect to the deposition source. A process module may include more than one deposition source, e.g., two deposition sources. Then, there may be more than one process position per process module. A process module with more than one deposition source may be a triple-track or even quadruple-track module, e.g., a fully relatively moveable triple-track or quadruple track module. The tracks thereof may be alignable with the more than one process positions. Details about dual-track and multi-track substrate transfer devices allowing track switching/exchange, about the corresponding movements of substrate support elements, and about the routing of carriers or substrates through the different modules can be found in PCT/EP2012/067659 and PCT/EP2012/067656.

The substrate processing system includes a substrate transportation system. The substrate transportation system is a system for transporting and/or routing substrates or substrate carriers through the substrate processing system. The substrate transportation system is a system for transporting substrates or substrate carriers into and out of the deposition chamber(s). The components for substrate transfer, e.g., the substrate transfer devices of the individual modules described herein or in PCT/EP2012/067659 and PCT/EP2012/067656, may form the substrate transportation system.

The substrate processing system includes at least one shielding element, e.g., an edge exclusion shield. An edge exclusion shield may be located in its working position in a process module, in particular in a deposition chamber. An edge exclusion shield may be located in a maintenance station for maintenance or be on its way to the maintenance station or from the maintenance station back to its working position. Edge exclusion shields include a shielding portion configured for excluding the deposition of material onto substrate edges. When an edge exclusion shield is in its working position and a substrate or substrate carrier is in its process position, material from a deposition source in the process chamber is prevented from coating the edges of the substrate. The edges of a substrate may be as wide as 20% of the length or width of a substrate, or may be less, e.g., 15% or less, 10% or less, or 5% or less of the length or width of a substrate. Typically, the edges of the substrates are 1% or less of the length or width of a substrate. The dimensions of an edge exclusion mask may be adapted to the substrate size.

According to an embodiment, a method for extracting a shielding element from a processing chamber of a substrate processing system or inserting the shielding element into the processing chamber is provided. The processing chamber may be a vacuum processing chamber, in particular a high vacuum processing chamber as described herein. In some embodiments, the method is a method for the maintenance of an edge exclusion shield of a substrate processing system. For simplicity, and without intending a limitation, reference will be made to an edge exclusion shield, to the deposition of material and to a deposition chamber. The substrate processing system includes a deposition chamber, a first edge exclusion shield, and a substrate transportation system.

The method includes transporting the first edge exclusion shield by the substrate transportation system. This is illustrated in the block diagram of FIG. 19, at reference sign 1900. Transporting the first edge exclusion shield by the substrate transportation system may include transporting the first edge exclusion shield into or out of a deposition chamber, into or out of a vacuum portion of a substrate processing system, and/or to or from a maintenance station for edge exclusion shields.

When the transport of the first edge exclusion shield makes use of at least a part of the components of the substrate transportation system normally used for substrate or carrier transport, the edge exclusion shield is said to be transported by the substrate transportation system. For instance, if only one substrate support assembly or only some of its support elements, e.g., a set of rollers, is used for the transport of the edge exclusion shield, this qualifies as transportation by the substrate transportation system. The transportation by the substrate transportation system may additionally use components that are not used for transporting substrates or substrate carriers. This does not disqualify the transport as a transport by the substrate transportation system.

By using the substrate transportation system for transporting an edge exclusion shield, the need to open the (vacuum) deposition chamber to replace the edge exclusion shield may no longer exist. Therefore, the time to replace an edge exclusion shield may be shorted and/or more predictable. The cycles after which the deposition chamber needs to be opened may, e.g., be as long as the target lifetime of a sputter target in the deposition chamber. The output of the substrate processing system may be increased.

In some embodiments, the first edge exclusion shield may be passively transported. A passive transport means that the edge exclusion shield does not directly engage with the substrate transportation system, but is carried by another device which is called hook-up device herein.

A hook-up device may have the same or similar outer dimensions in at least one direction as compared to a substrate or substrate carrier. The hook-up device may have one dimension, called height hereafter, which fits into the space formed between support elements of a substrate transfer assembly, e.g., between upper and lower support elements such as rollers and magnetic support elements. The height of the hook-up device may be the same as, or similar to, the corresponding height of a substrate or carrier. The height of a substrate or carrier is its dimension perpendicular to the transport direction and perpendicular to the switch direction, i.e., its dimension along the evasion direction. The lengths of the hook-up device and of a substrate or substrate carrier may also be the same or similar, the length being measured in the transport direction when the substrate, substrate carrier or hook-up device is in the substrate transportation system. A hook-up device may be configured to take the place of a substrate or substrate carrier in the substrate transportation system, so it can be transported therein.

Figure 19:
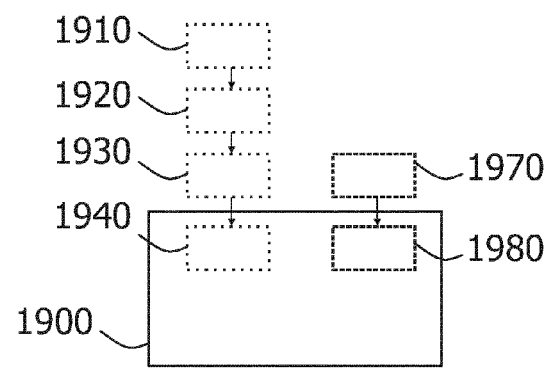
FIG. 19 is a block diagram illustrating methods of maintaining an edge exclusion shield according to embodiments described herein.

The method may include loading a first hook-up device into the substrate transportation system, shown as an optional feature by dotted lines in FIG. 19 at reference sign 1910. The first hook-up device may be loaded into the substrate transportation system in the front end module. The hook-up device may include a framing portion. The framing portion may include a first guiding element, e.g., a round bar or other mechanical guiding element configured to engage with a set of support elements of the substrate transportation system, e.g., rollers. The framing portion may include a second guiding element, e.g., a magnetic guiding element including magnetic or magnetizable material configured to engage with another set of support elements of the substrate transportation system such as magnetic support elements. The first and/or second guiding elements may be configured to have the same or a similar shape as corresponding parts of a substrate or substrate carrier used to engage with the substrate transportation system. Loading the hook-up device may include bringing the hook-up device into engagement with the support elements of a substrate support assembly of a substrate transfer device, wherein the engagement with some support elements may with contact, e.g., a mechanical engagement, or may be contactless, e.g., a magnetic engagement. Therein, the guiding elements of the framing portion may be brought into engagement with the support elements.

The method may include transporting the first hook-up device into the deposition chamber, shown in FIG. 19 at reference sign 1920. The deposition chamber includes the first edge exclusion shield, and the hook-up device may be transported to the first edge exclusion shield. Transporting the hook-up device may include at least one of the following features: transport along the substrate transport direction, e.g., by driven support elements of a substrate support assembly, typically along a substrate transport path; transport along the switch direction, e.g., by a substrate support assembly in the deposition chamber, typically from a position on a substrate transport path to or into the vicinity of a substrate processing position. The hook-up device may be transported from the front end module through one or more load modules and possibly also process modules. The hook-up device may therein pass locks arranged between these modules.

The method may further include hooking up the first edge exclusion shield with the first hook-up device, shown in FIG. 19 at reference sign 1930. The hook-up device may include a hook-up portion for engaging an engagement portion of the edge exclusion shield. The engagement portion of the edge exclusion shield may be connected to, or form part of, the shielding portion or of a framing portion surrounding the shielding portion. The hook-up portion may include a hook-up element such as a hook, clamp, plug or other male fastening element. The engagement portion of the edge exclusion shield may include a recess, notch, socket or other female fastening element. The arrangement of male and female fastening elements on the hook-up and engagement portions can be the other way round. The hook-up portion may be configured for engagement with the engagement portion of the edge exclusion shield, e.g., for mechanical engagement to hook up and hold the edge exclusion shield for joint transportation in the substrate transportation system.

Transporting the first edge exclusion shield by the substrate transportation system may include transporting the first hook-up device that holds the first edge exclusion shield out of the deposition chamber by the substrate transportation system, shown in FIG. 19 as another optional feature at reference sign 1930. Transporting the first edge exclusion shield by the substrate transportation system may include transporting the first or a second hook-up device carrying the substrate into the deposition chamber by the substrate transportation system, e.g., after the first edge exclusion shield has been maintained in a maintenance station.

The substrate transportation system may be configured for supporting the weight and/or dimensions of the coupled edge exclusion shield and hook-up device. Locks between modules have openings dimensioned to allow passage of the coupled edge exclusion shield and hook-up device. The height (in evasion direction) of the openings may be adapted to the height of the edge exclusions shield. The width (in switch direction) of the openings may be adapted to the combined widths of the hook-up device and the edge exclusion shield. The openings may have a variable size depending on whether substrates or substrate carriers are transported or whether an edge exclusion shield is transported. For instance, movable plates may enlarge or diminish the size of the openings. In this way, the openings may be kept small during substrate processing, reducing the deterioration of the vacuum or the exchange of particles between different chambers.

The substrate processing system may include a second edge exclusion shield, or any number of further edge exclusion shields. The method may include transporting a second edge exclusion shield by the substrate transportation system, e.g. into or out of the deposition chamber. The second edge exclusion shield may be transported simultaneously with the first edge exclusion shield. For instance, the first edge exclusion shield may be transported along one substrate transport path and the second edge exclusion shield may be transported along a different substrate transport path, at least in some time period of the transportation process.

The second edge exclusion shield may be passively transported. The method may include loading a second hook-up device into the substrate transportation system. The second hook-up device may be loaded subsequently to the loading of the first hook-up device, e.g., directly after loading the second hook-up device. The second hook-up device may hold a hooked-up second edge exclusion shield, e.g., a fresh or maintained edge exclusion shield. The method may include transporting the second hook-up device holding the hooked-up second edge exclusion shield into the deposition chamber. The second edge exclusion shield may be installed in the deposition chamber, in particular in a working position.

The substrate processing system may include a shield frame. The shield frame may be arranged in a working position in the deposition chamber. The installation of any edge exclusion shield may include inserting the edge exclusion shield into the shield frame. The shield frame may be cooled, e.g., by water-cooling. The shield frame can then cool the edge exclusion shield during the deposition process. Installing the second edge exclusion shield may be performed subsequently to the hooking up of the first edge exclusion shield with the first hook-up device. The method may include transporting the empty second hook-up device out of the deposition chamber using the substrate transportation system.

In some embodiments, the first, second and/or any further edge exclusion shield may be actively transported. An active transport means that the edge exclusion shield itself engages with some parts of the substrate transportation system. A hook-up device is not needed in these embodiments.

The method may include transferring the first edge exclusion shield from a working position within a shield frame arranged in the deposition chamber to the substrate transportation system, shown as an optional feature in FIG. 19 at reference sign 1970.

The first edge exclusion shield may include an engagement portion for transferring the edge exclusion shield from the position within a shield frame to the substrate transportation system. The first edge exclusion shield may include a shielding portion and a framing portion outward from the shielding portion, e.g., surrounding it at least on two sides or on all sides. The engagement portion may be connected with, or form part of, the framing portion or the shielding portion. The engagement portion may be a mechanical engagement portion, e.g., a protrusion, a knob, any male fastening portion, or a recess, a notch or any female fastening portion.

The framing portion of the first edge exclusion shield may include a first guiding element, e.g., a round bar or other mechanical guiding element configured to engage with a set of support elements of the substrate transportation system, e.g., rollers. The framing portion may include a second guiding element, e.g., a magnetic guiding element including magnetic or magnetizable material configured to engage with another set of support elements of the substrate transportation system such as magnetic support elements. The first and/or second guiding elements may be configured to have the same or a similar shape as corresponding parts of a substrate or substrate carrier used to engage with the substrate transportation system. Transferring the first edge exclusion shield from a working position to the substrate transportation system may include bringing the first edge exclusion shield into engagement with the support elements of a substrate support assembly of a substrate transfer device, wherein the engagement with some support elements may be with contact, e.g., a mechanical engagement, or may be contactless, e.g., a magnetic engagement. Therein, the guiding elements of the framing portion of the first edge exclusion shield may be brought into engagement with the support elements. Other edge exclusion shields may have the same properties.

The shield frame may include a transfer portion, e.g., a mechanical transfer portion such as a lever or system of levers. The transfer portion may be adapted to engage the engagement portion of the first or any other edge exclusion shield for transferring the edge exclusion shield from the position within the shield frame to the substrate transportation system. The shield frame may include a power source or be connected to an external power source for the transfer of an edge exclusion shield to the substrate transportation system.

Transporting the first edge exclusion shield may include transporting the first edge exclusion shield out of the deposition chamber by the substrate transportation system, as shown in FIG. 9 at reference sign 1980. The first or any other edge exclusion shield may be transported solo, i.e., alone, in the substrate transportation system. The first edge exclusion shield may also be transported into the deposition chamber, e.g., after it has been maintained. Similarly, a second or any further edge exclusion shield may be transported into or out of the deposition chamber by the substrate transportation system. The first, second or any further edge exclusion shield may be transferred from the substrate transportation system to the working position within the shield frame. The components described hereinbefore may engage or disengage for the transport or the transfer. For instance, the first edge exclusion shield and/or the second edge exclusion shield may be transferred to or out of the working position within the shield frame by mechanical engagement.

Whether active transport or passive transport of one or more edge exclusion shields is employed, the method may include determining whether the first edge exclusion shield needs replacement. The determination may include estimating the amount of material deposited on the first edge exclusion mask from the time period that material has been deposited off a target and basing the determination on this estimation. The determination may additionally or alternatively include measuring the deposition uniformity and/or the presence of particles on a substrate ex situ and basing the determination on the measured uniformity data and/or the measured particle data. The substrate processing system may include corresponding sensors and one or more controllers to automatically perform the determination and to initiate replacement of the edge exclusion shield.

Determining whether the first/second edge exclusion shield needs replacement may include comparing the measured uniformity data and/or particle data to one or more patterns, and positively determining that the first/second edge exclusion shield needs replacement if the deviation from the one or more patterns surpasses a threshold and negatively determining that the first edge exclusion shield does not yet need replacement if the deviation from the one or patterns does not surpass the threshold. The first hook-up device and/or the second hook-up device, or in the case of active transport, the first edge exclusion shield and/or second edge exclusion shield may be automatically loaded into the transportation system in response to a positive determination that the first or second edge exclusion shield needs replacement.

The method may further include performing maintenance on the first edge exclusion shield or any other edge exclusion shield that has been moved out of the deposition chamber or out of the vacuum portion of the substrate processing system, e.g., to a maintenance station. Maintaining an edge exclusion shield may include removing material deposited on the edge exclusion shield during deposition in the deposition chamber. The method may include transporting the maintained first edge exclusion shield, or any other maintained edge exclusion shield, into the deposition chamber using the substrate transportation system. The maintained first edge exclusion shield, or any other edge exclusion shield, may be installed or re-installed, as the case may be, in the deposition chamber. Installing or re-installing may include insertion into a shield frame.

The method may include conditioning the installed or re-installed first edge exclusion shield and/or conditioning any other installed or re-installed edge exclusion shield. Conditioning may include heating and/or a plasma treatment. The substrate processing system may include a corresponding heating device and/or a plasma cleaning device, typically arranged in the deposition chamber.

Further embodiments are directed to shielding elements such as edge exclusion shields as described herein, e.g., in combination with a shield frame as described herein. Other embodiments are directed to the combination of a shielding element, e.g., an edge exclusion shield, and a hook-up device as described herein. Yet further embodiments are directed to a substrate processing system including at least one shielding element such as an edge exclusion shield as described herein, and possibly at least one hook-up device and/or shield frame as described herein. These systems and their components may have any of the structural and/or functional features described with respect to the methods for maintenance of edge exclusion shields.

Figure 20:
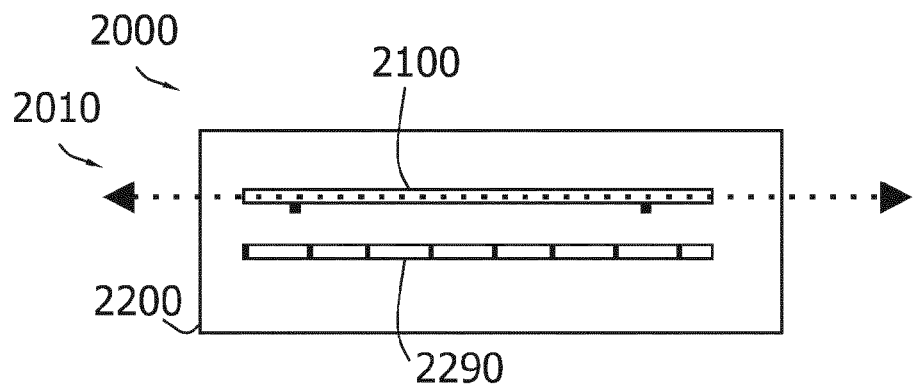
FIGS. 20-21 show schematic illustrations of substrate processing systems according to embodiments described herein.

FIG. 20 schematically shows a substrate processing system 2000 including a processing chamber 2200. The substrate processing system 2000 includes a substrate transportation system 2010 suitable for transporting substrates or substrate carriers into or out of the processing chamber 2200, symbolically illustrated by the dotted double arrow. The substrate processing system includes a hook-up device 2100 and a shielding element 2290. The hook-up device is adapted for transport in the substrate transportation system. The hook-up device and the shielding element 2290 are configured for engaging each other. The substrate transportation system may be adapted for joint transport of the hook-up device and the shielding element while they are engaged with each other, in particular for joint transport of the hook-up device and the shielding element into or out of the processing chamber 2200.

Figure 21:
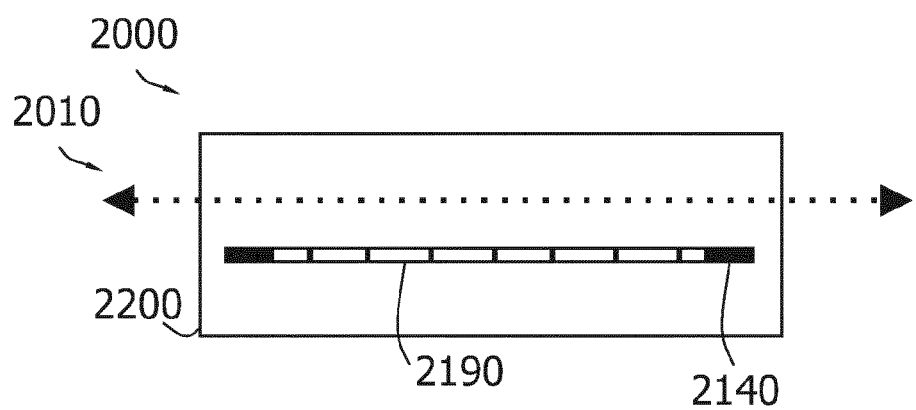

FIG. 21 schematically shows an alternative, wherein the substrate processing system includes a shield frame 2140 for supporting a shielding element 2190. The shielding element 2190 is adapted for transport in the substrate transportation system 2010. The shielding element may be adapted for stand-alone transport in the substrate transportation system 2010 into or out of the processing chamber 2200.

The terms and expressions which have been employed herein are used as terms of description and not of limitation, and there is no intention, in the use of such terms and expressions, of excluding any equivalents of the features shown and described or portions thereof. While the foregoing is directed to embodiments, other and further embodiments may be devised without departing from the scope, and the scope is determined by the claims that follow.

The invention claimed is:

1. A method for extracting a shielding element from a processing chamber of a substrate processing system or inserting the shielding element into the processing chamber, the substrate processing system including the processing chamber, a first shielding element for excluding an application of material onto parts of a substrate, and a substrate transportation system for transporting substrates or substrate carriers into and out of the processing chamber, the method comprising:
   loading a first hook-up device into the substrate transportation system;
   transporting the first hook-up device into the processing chamber to the first shielding element, wherein the first shielding element is disposed in the processing chamber;
   hooking up the first shielding element with the first hook-up device; and
   transporting the first hook-up device that holds the first shielding element out of the processing chamber by the substrate transportation system.

2. The method according to claim 1, wherein the first shielding element is transported out of the processing chamber by the substrate transportation system, the method further comprising:
   transporting a second shielding element into the processing chamber by the substrate transportation system.

3. The method according to claim 2, further comprising:
   loading a second hook-up device into the substrate transportation system, the second hook-up device holding the second shielding element;
   transporting the second hook-up device holding the second shielding element into the processing chamber;
   installing the second shielding element in the processing chamber; and
   transporting the empty second hook-up device out of the processing chamber using the substrate transportation system.

4. The method according to claim 3, comprising:
   conditioning at least one of the installed second shielding element and a re-installed first shielding element, wherein conditioning comprises at least one of heating and plasma-cleaning.

5. The method according to claim 2, further comprising:
   transferring the second shielding element from the substrate transportation system to a working position within a shield frame arranged in the processing chamber.

6. The method according to claim 5, further comprising: determining whether the first shielding element needs replacement, wherein determining whether the first shielding element needs replacement comprises at least one of:
   estimating the amount of material applied on the first shielding element from the time period that material has been applied from a source and basing the determination on this estimation; and
   measuring at least one of the processing uniformity and the presence of particles on a substrate ex situ and basing the determination on at least one of the measured uniformity data and the measured particle data.

7. The method according to claim 5, wherein the second shielding element is hooked up, or respectively transferred, to or out of the working position within the shield frame, by mechanical engagement.

8. The method according to claim 1, wherein the first shielding element is transported out of the processing chamber by the substrate transportation system, the method further comprising:
   transporting a second shielding element into the processing chamber by the substrate transportation system.

9. The method according to claim 8, further comprising:
   loading a second hook-up device into the substrate transportation system, the second hook-up device holding the second shielding element;
   transporting the second hook-up device holding the second shielding element into the processing chamber;
   installing the second shielding element in the processing chamber; and
   transporting the empty second hook-up device out of the processing chamber using the substrate transportation system.

10. A method for extracting a shielding element from a processing chamber of a substrate processing system or inserting the shielding element into the processing chamber, the substrate processing system including the processing chamber, a first shielding element for excluding an application of material onto parts of a substrate, and a substrate transportation system for transporting substrates or substrate carriers into and out of the processing chamber, the method comprising:
   transferring the first shielding element from a working position within a shield frame arranged in the processing chamber to the substrate transportation system, wherein the shield frame remains in the processing chamber; and
   transporting the first shielding element out of the processing chamber by the substrate transportation system.

11. The method according to claim 10, wherein the first shielding element is hooked up, or respectively transferred to or out of the working position within the shield frame, by mechanical engagement.

12. The method according to claim 10, further comprising:
   transporting a second shielding element into the processing chamber by the substrate transportation system.

13. The method according to claim 12, further comprising:
   loading a second hook-up device into the substrate transportation system, the second hook-up device holding the second shielding element;
   transporting the second hook-up device holding the second shielding element into the processing chamber;

installing the second shielding element in the processing chamber; and transporting the empty second hook-up device out of the processing chamber using the substrate transportation system.

* * * * *